United States Patent [19]

Kishida et al.

[11] Patent Number: 4,864,579
[45] Date of Patent: Sep. 5, 1989

[54] SEMICONDUCTOR INTEGRATED CIRCUIT DEVICE

[75] Inventors: Satoru Kishida; Kazuhiro Sakashita; Ichiro Tomioka, all of Hyogo, Japan

[73] Assignee: Mitsubishi Denki Kabushiki Kaisha, Hyogo, Japan

[21] Appl. No.: 81,094

[22] Filed: Aug. 3, 1987

[30] Foreign Application Priority Data

Aug. 4, 1986 [JP] Japan .................. 61-183682
Aug. 4, 1986 [JP] Japan .................. 61-183687

[51] Int. Cl.$^4$ ............................. G06F 11/00
[52] U.S. Cl. ....................... 371/22.3; 371/25.1
[58] Field of Search ................ 371/25, 21, 15, 27, 371/62; 364/200, 900; 324/158 R

[56] References Cited

U.S. PATENT DOCUMENTS

| | | | |
|---|---|---|---|
| 4,063,080 | 12/1977 | Eichelberger et al. | 371/62 |
| 4,225,958 | 9/1980 | Funatsu | 371/15 |
| 4,244,048 | 1/1981 | Tsui | 371/15 |
| 4,476,431 | 10/1984 | Blum | 371/25 |
| 4,493,077 | 1/1985 | Agrawal | 371/25 |
| 4,513,418 | 4/1985 | Bordell, Jr. et al. | 371/25 |
| 4,554,664 | 11/1985 | Schultz | 371/25 |
| 4,580,137 | 4/1986 | Fiedler | 371/25 |
| 4,621,363 | 11/1986 | Blum | 371/25 |
| 4,688,588 | 10/1987 | Hwang et al. | 137/13 |
| 4,701,922 | 10/1987 | Kuboki et al. | 371/25 |
| 4,703,257 | 10/1987 | Nishida et al. | 324/158 R |
| 4,752,729 | 6/1988 | Jackson et al. | 371/15 |

FOREIGN PATENT DOCUMENTS 52-28614 3/1977 Japan .
56-74668 6/1981 Japan .

Primary Examiner—Michael R. Fleming
Attorney, Agent, or Firm—Nixon & Vanderhye

[57] ABSTRACT

A semiconductor integrated circuit device for transmitting data between a plurality of circuit blocks at least one thereof including a sequential circuit and enabling the circuit blocks to test in a scan testing type which has a plurality of scan registers provided between the plurality of circuit blocks corresponding to the number of bits of data to be transmitted for outputting the output data of the previous stage circuit block as it is at ordinary operating time and for holding and outputting the output data of the previous circuit block or test data for scan test synchronously with an external clock at testing time so that the circuits are connected by a shift register pass in such a manner that the entirety has one shaft register function, and a latch circuit provided at its data input terminal to the data output terminal of the corresponding scan register for outputtting the output data of the corresponding scan register as it is to the circuit block of next stage at ordinary operation time and holding the output data of the corresponding scan register before the scanning operation in a scan mode at testing time to continuously apply the data to the circuit block of next stage and holding and outputting the output data of the corresponding scan register in a test mode synchronously with the external clock, test data setting means for setting serial data of test from the exterior of the circuit device to each of the scan registers, test result outputting means for sequentially outputting the data of each scan register as serial data out of the circuit device, and operation switching means for switching the ordinary operation and the testing operation and switching the scan mode and the test mode, thereby enabling the semiconductor integrated circuit device to be readily subjected to a scan test together with circuit blocks including asynchronous sequential circuits.

3 Claims, 7 Drawing Sheets

SEMICONDUCTOR INTEGRATED CIRCUIT DEVICE

BACKGROUND OF THE INVENTION

The present invention relates to a semiconductor integrated circuit device and, more particularly, to a testing circuit for a semiconductor integrated circuit device employing a scan pass.

The integration of a semiconductor integrated circuit device has been remarkably improved by the progress microminiaturization techniques and can be expected to be further enhanced in future. The difficulty of testing semiconductor integrated circuit devices has been exponentially increased as this integration (number of gates) has increased. The ease of testing the semiconductor integrated is determined by two points of the ease (observance) of observing the defect of each terminal and the ease (controllability) of setting each terminal to a desired logic value. Deep terminals of large-scale logic circuit network become in general difficult in both observance and controllability.

Scan testing systems for testing semiconductor integrated circuit devices are known as scan testing systems, which improve the observance and the controllability of the deep terminals of large-scale logic circuit networks observe large-scale logic circuit network by inserting register circuits each including a shift register function into proper positions of the logic circuit network, connecting the register circuits by one shift register pass, serially inputting a test pattern from the exterior of a chip at testing time to set predetermined data in the registers, applying a desired logic signal to the logic circuit connected to the data output terminals of the registers to operate the logic circuit, inputting the result from the parallel input terminals of the registers in parallel in the registers, and then serially outputting them out of the chip to observe them.

A fundamental idea of a scan testing system regarding a level sensitive synchronizer circuit is disclosed in Japanese Patent Laid-open No. 28614/1977.

Since the circuit to be observed includes an asynchronous sequential circuit here, the scan testing system will be described with reference to Japanese Patent Laid-open No. 74668/1981 as a prior art.

FIG. 3 shows a prior-art example of a scan pass type testing circuit type with an asynchronous sequential circuit to be observed. In FIG. 3, reference numerals 35 and 37 denote blocks of combination circuits, numeral 36 denotes an asynchronous circuit block including a sequential circuit, numerals 8 to 16 denote scan registers provided between the circuit blocks, and numerals 26 to 34 denote data selectors for selecting any of the outputs of the corresponding circuit blocks and the outputs of the scan registers to output the selected output. The output signals of the respective circuit blocks are connected directly to the data input terminals D of the scan registers and the data input terminals D of the data selectors, respectively, and the output terminals Q of the corresponding scan registers are connected to the test data input terminals TD of the data selectors, respectively.

In FIG. 1, reference numeral 1 denotes a test mode selection terminal, which is connected to the mode selection terminals MS of the scan registers and the data selectors, respectively. Numeral 2 denotes a scan-in terminal, and numeral 38 denotes a scan-out terminal. The scan-in terminal 2 is connected to the scan-in terminal SI of the scan register 8, and the output terminal Q of the scan register 8 is connected to the scan-in terminal SI of the scan register 9. Thus, the output terminals Q of the respective scan registers are sequentially connected to the scan-in terminals SI of the next scan registers to resultantly form a shift register pass between the scan-in terminal 2 and the scan-out terminal 38. Numerals 3 to 5 denote ordinary data input terminals, numeral 6 denotes a scan clock input terminal, which is connected to the clock input terminals T of the scan registers.

FIG. 4 shows an example of the scan register shown in FIG. 3, symbol MS denotes a mode selection terminal, symbol D denotes a data input terminal, symbol IS denotes a scan-in terminal, and symbol T denotes a clock input terminal. Numeral 151 denotes an inverter gate, numerals 152 and 153 denote 2-input AND gates, numeral 154 denotes a 2-input OR gate, numeral 155 denotes an edge trigger D type flip-flop (hereinbelow referred to as "D-FF"), and symbol Q denotes a data output terminal.

FIG. 5 shows an example of the data selector shown in FIG. 3. Symbol MS denotes a mode selection terminal, symbol TD denotes a test data input terminal, symbol D denotes a data input terminal, numeral 160 denotes an inverter gate, numerals 161 and 162 denote 2-input AND gates, numeral 163 denotes a 2-input OR gate, and symbol Y denotes an output terminal.

The operation of the scan pass type testing circuit will be described.

The ordinary operation will be first described. In this case, a signal "H" is applied to the test mode selection terminal 1 (MS), and the scan clock terminal 6 (TS or T) is fixed to a voltage "L". As a result, the input and output terminals of the corresponding circuit blocks are connected directly through the respective data selectors.

This operation will be described with reference to FIG. 5. When a signal "H" is applied to the mode selection terminal MS of the data selector, the data from the data input terminal D is outputted through the AND gate 162 and the OR gate 163 to the output terminal Y. Since the output of the circuit block is connected directly to the data input terminal D of this data selector, the input and output terminals of the corresponding circuit block are connected directly.

The scan mode and the test mode are sequentially repeated as below at testing time to test the respective circuit blocks.

(1) Scan Mode (a) A signal "H" is applied to the test mode selection terminal 1 to set the scan mode. Thus, the scan register selects the input data from the scan-in terminal Si, and the data selector validates the input data from the data input terminal D.

(b) Further, the test data set in the respective scan registers from the scan-in terminal 2 are sequentially scanned in synchronously with the clock applied to the scan clock terminal 6.

(c) Simultaneously the output data inputted to the respective circuit blocks at the previous testing time are sequentially scanned out from the scan-out terminal 38.

This operation will be described with reference to FIGS. 4 and 5. When a signal "H" is first applied to the mode selection terminal MS of the scan register, the data from the scan-in terminal SI is held in D-FF 55 synchronously with the clock applied to the clock terminal T through the AND gate 153 and the OR gate 154, and the data held simultaneously is output from the output terminal Q. The signal "H" is also applied to the mode selection terminal MOS of the data selector at this time, and the data from the data input terminal is outputted to the output terminal Y.

(2) Test Mode (a) After the desired data are set in the respective scan registers, a voltage "L" is applied to the test mode selection terminal 1 to set a test mode.

(b) Thus, the output data of the scan register is applied through the test data input terminal TD of the data selector to the respective circuit blocks.

(c) Simultaneously, the desired test data are applied to the data input terminals 3 to 5.

(d) When the operations of the circuit blocks have been completed, a clock is applied to the scan clock input terminal 6. Thus, the output signals of the respective circuit blocks are held in D-FF in the scan registers through the data input terminals D of the corresponding scan registers.

These operations will be described with reference to FIGS. 4 and 5. When a voltage "L" is first applied to the mode selection terminal MOS of the scan register, the data from the data input terminal D is held in D-FF 155 synchronously with the clock applied to the clock input terminal T through the AND gate 152 and the OR gate 154. Since the voltage "L" is also applied to the mode selection terminal MOS of the data selector at this time, the data from the test data input terminal TD is outputted to the output terminal Y through the AND gate 161 and the OR gate 163.

Thus, the respective circuit blocks can be tested. The data selectors in the circuits select the output data of the respective circuit blocks during the scanning operation. In this manner, even if the output value of the scan register is sequentially varied during the scanning operation, the state of the circuit block 35 including the sequential circuit is inhibited to vary. Therefore, even if the circuit block surrounded by the scan pass is the asynchronous sequential circuit as in this example, the scanning test can be performed.

Since the conventional scan testing system is constructed as described above, the system can execute the scan test for the block including the asynchronous sequential circuit. However, when the test mode is switched to the scan mode, the data applied to the sequential circuit is generally varied from the serially inputted signal value to the output signal value of the adjacent circuit block. Thus, it is difficult to set the input so that the state of the asynchronous sequential circuit to be observed may not vary. In many cases, there arises a drawback that the scan test cannot be effectively carried out.

SUMMARY OF THE INVENTION

An object of the present invention is to provide a semiconductor integrated circuit device which can eliminate the above-mentioned drawbacks and disadvantages and which can be readily subjected to a scan test together with circuit blocks including asynchronous sequential circuits.

In order to achieve these and other objects, there is provided according to one aspect of the present invention a semiconductor integrated circuit device comprising a scan register provided between circuit blocks to be tested for outputting input data as it is in a through state between input and output terminals at ordinary operation time and holding and outputting input data at testing time, and a latch circuit connected to the output terminal of the scan register for holding the output data of the scan register at ordinary operation time and in a test mode at testing time and holding the test data before scanning operation in a scan mode at testing time to continuously applying it to the circuit block of next stage.

In this aspect of the present invention, the scan register and the latch circuit connected to the output terminal of the scan register are set in the through state at the ordinary operation time to connect the input and output terminals of the corresponding circuit block, while the latch circuit connected to the output terminal of the scan register are set in the non-through state at the testing time to hold the data to be applied at previous time during the scan mode to continuously apply the test data to the corresponding circuit block.

In order to achieve these and other objects, there is provided according to another aspect of the present invention a semiconductor integrated circuit device comprising a scan register provided between circuit blocks to be tested and having first and second latches for outputting input data as it is in a through state at least between an input terminal and the first latch output terminal at ordinary operation time and holding and outputting the input data at testing time, and a latch circuit connected to the output terminal of the first latch for holding the output data of the scan register at ordinary operation time and in a test mode at testing time and holding the test data before scanning operation in a scan mode at testing time to continuously applying it to the circuit block of next stage.

In this another aspect of the present invention, the circuit from the input terminal in the scan register to the output terminal of the first latch and the latch circuit connected to the output terminal of the first latch are set in the through state at the ordinary operation time to connect the input and output terminals of the corresponding circuit block, while the latch circuit connected to the output terminal of the first latch of the scan register are set in the non-through state at the testing time to hold the data to be applied at previous time during the scan mode to continuously apply the test data to the corresponding circuit block.

DETAILED DESCRIPTION OF THE PREFERRED EMBODIMENTS

Figure 1:
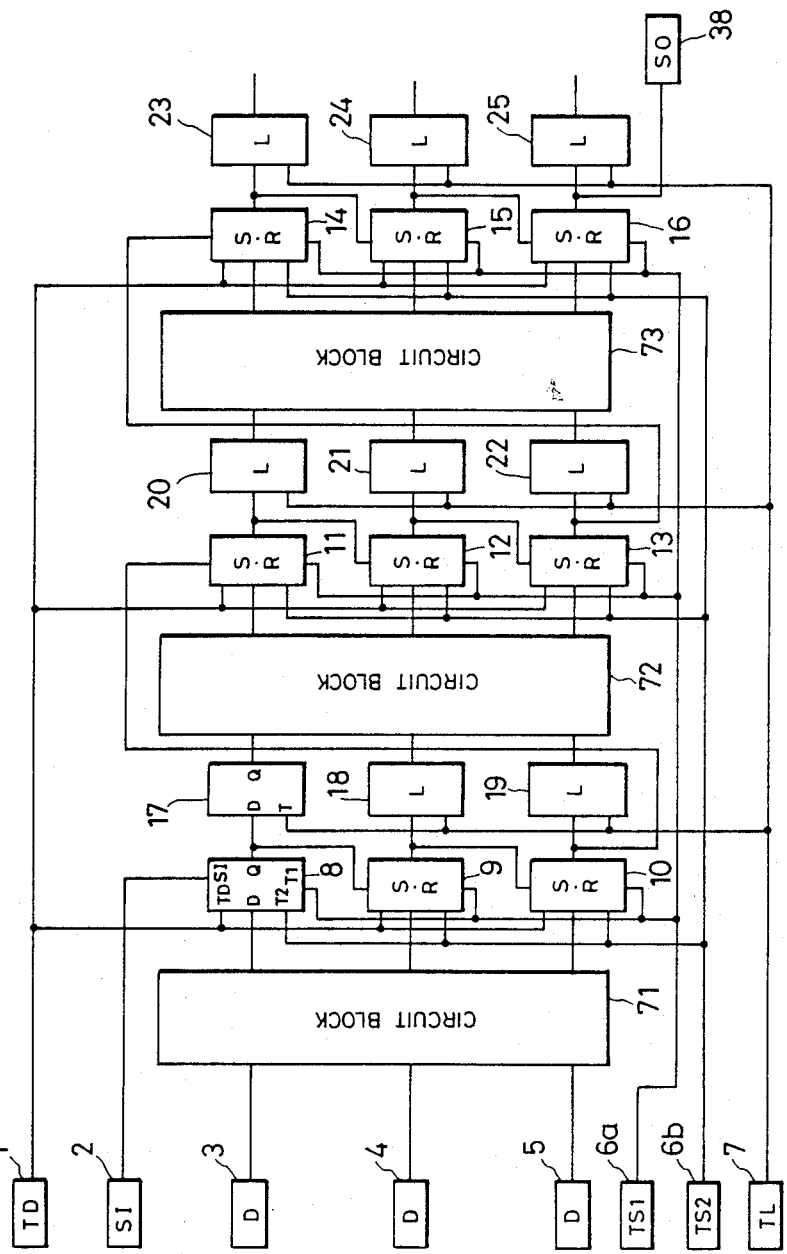
FIG. 1 is a circuit diagram of an embodiment of a semiconductor integrated circuit device according to the present invention.

FIG. 1 shows the construction of an embodiment of a scan testing circuit according to the present invention. In FIG. 1, reference numerals 71 to 73 denote circuit blocks formed of combination circuits or sequential circuits, and numerals 8 to 16 denote scan registers provided between the circuit blocks to be able to switch to a through state. Numerals 17 to 25 denote latch circuits connected to the output terminals of the corresponding scan registers to be similarly able to switch to a through state. Numeral 1 denotes a data clock input terminal, which is connected to the data input terminals TD of the respective scan registers. Numeral 2 denotes a scan-in terminal, and numeral 38 denotes a scan-out. The scan-in terminal 2 is connected to the scan in terminal SI of the scan register 8, and the output terminal Q of the scan register 8 is connected to the scan-in terminal SI of the next scan register 9, the output terminal Q of the scan register is similarly sequentially connected to the scan-in terminal SI of the next scan register to resultantly form a scan pass between the scan-in terminal 2 and the scan-out terminal 38. The output terminals Q of the scan registers are connected to the data input terminals D of the corresponding latch circuits, respectively, and the output terminals Q of the latch circuits are connected to the input terminals of the corresponding circuit blocks, respectively.

Symbols 6a and 6b denote first and second scan clock input terminals. The first scan clock input terminal 6a is connected to the first clock terminal T1 of the scan register, and the second scan clock input terminal 6b is connected to the second clock terminal T2 of the scan register. Numerals 3 to 5 denote ordinary data input terminals, which are connected to the input terminals of the corresponding circuit blocks 71, and the output terminals of the respective circuit blocks are connected to the data input terminals D of the corresponding scan registers. Numeral 7 denotes a clock input terminal for the latch.

Figure 2A:
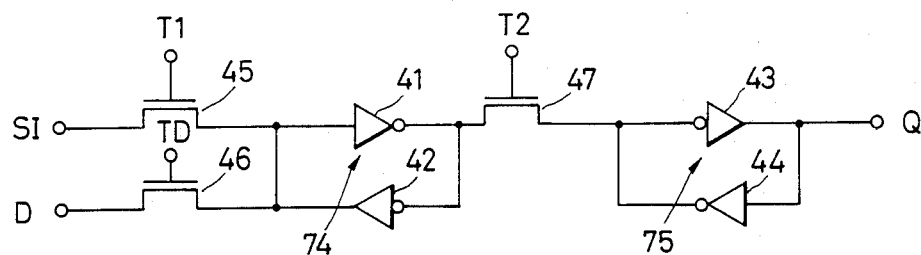
FIG. 2(a) is a circuit diagram showing an example of an arrangement of a scan register circuit of the circuit device.

FIG. 2(a) show an example of an arrangement of the scan register. The scan register has a first latch 74 and a second latch 75. In FIG. 2(a), symbol SI denotes a scan-in terminal, symbol D denotes a data input terminal, symbols T1 and T2 denote first, and second clock terminals, symbol TD denotes a data clock input terminal, numerals 41 to 44 denote inverters, numerals 45 to 47 denote n-type MOS transistors, symbol Q denotes an output terminal to construct a level sensitive scan register using 2-phase clocks.

Figure 2B:
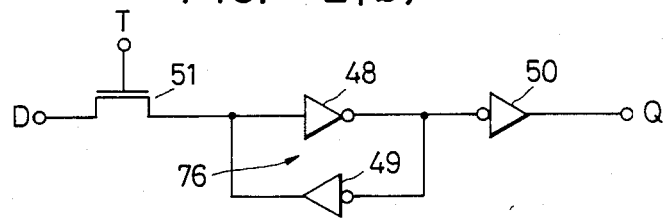
FIG. 2(b) is a circuit diagram showing an example of an arrangement of a latch circuit of the circuit device.
Figure 4:
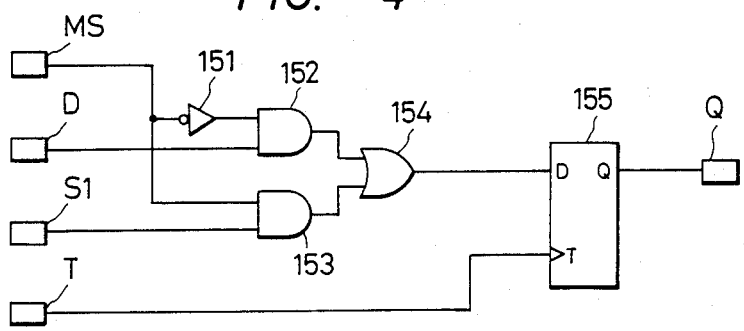
FIG. 4 is a circuit diagram showing a scan register circuit of the prior art device.
Figure 5:
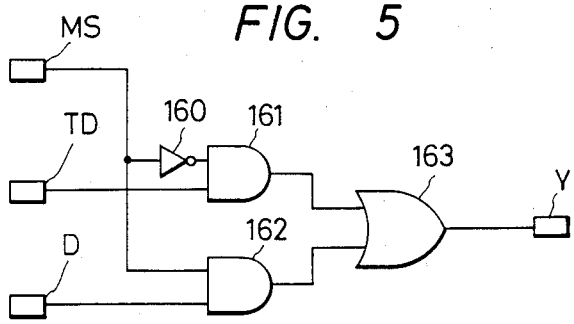
FIG. 5 is a circuit diagram showing a selector of the prior art device.
Figure 3:
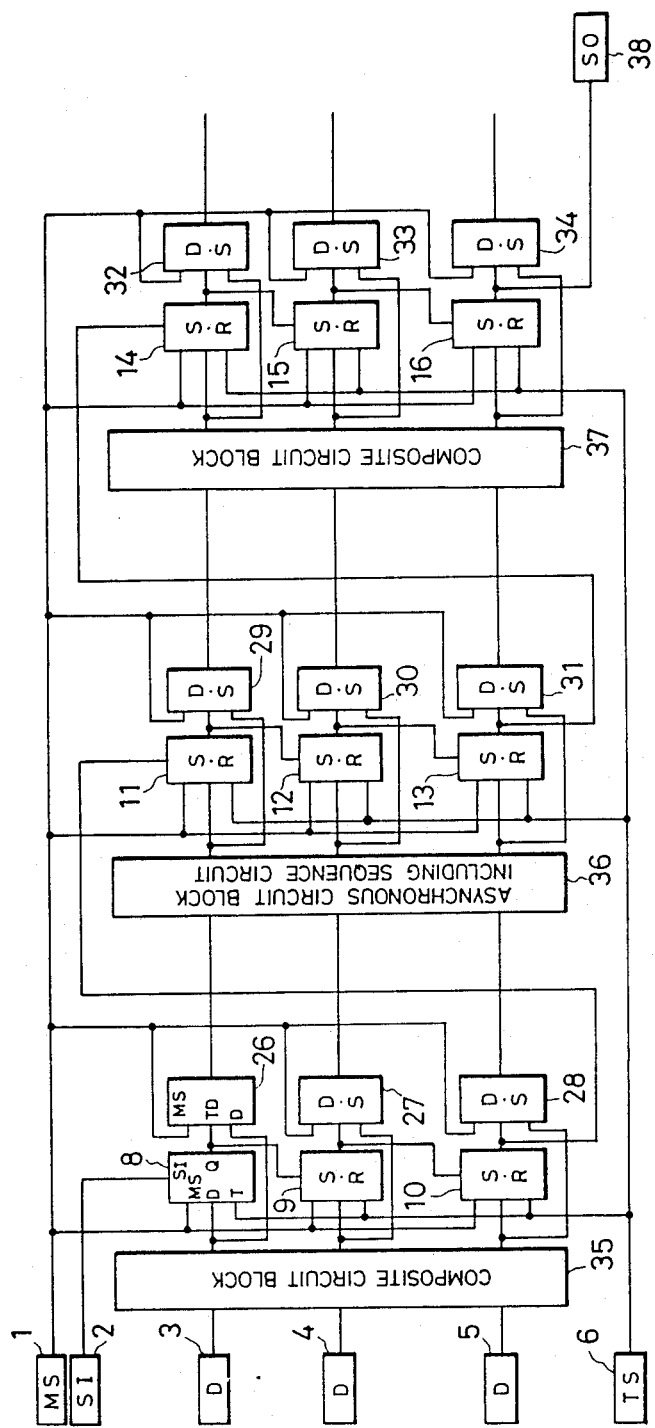
FIG. 3 is a circuit diagram of a prior-art semiconductor integrated circuit device.

FIG. 2(b) shows an example of an arrangement of the latch circuits 17 to 25, having a third latch 76. In FIG. 2(b), symbol D denotes a data input terminal, symbol T denotes a clock terminal, numerals 48 to 50 denote inverters, numeral 51 denotes an n-type MOS transistor, and symbol Q denotes an output terminal.

The operation will be described.

An ordinary operation will be first described. The first scan clock input terminal 6a is fixed to "L" (T1="L") and the second scan clock input terminal 6b, the data clock input terminal 1 and the clock input terminal 7 for the latch are fixed to "H" (T1, TD, T="H") at the ordinary operation time. As a result the input and output terminals of the corresponding circuit blocks are connected directly therebetween.

This operation will be described with reference to FIGS. 2(a) and 2(b). A signal "L" is applied to the first data clock input terminal T1 of the scan register, and a signal "H" is applied to the data clock input terminal TD and the second clock terminal T2 of the scan register at the ordinary operation time to set the data input terminal D to the output terminal Q in a through state. A signal "H" is applied to the clock terminal T of the latch circuit to set the data input terminal D to the output terminal Q in a through state. Thus, the data input and output terminals of the scan register and the latch circuit become the through state at the ordinary operation time, and the input and output terminals of the corresponding circuit block are connected directly therebetween at the ordinary operation time.

The scan mode and the test mode are sequentially repeated at the testing time as follows to execute the tests of the blocks. The waveforms of the timing of the signals are shown in FIG. 6.

(1) Scan Mode (a) A signal "L" (TD="L") is applied to the data clock input terminal 1 to set a scan mode.

Figure 6:
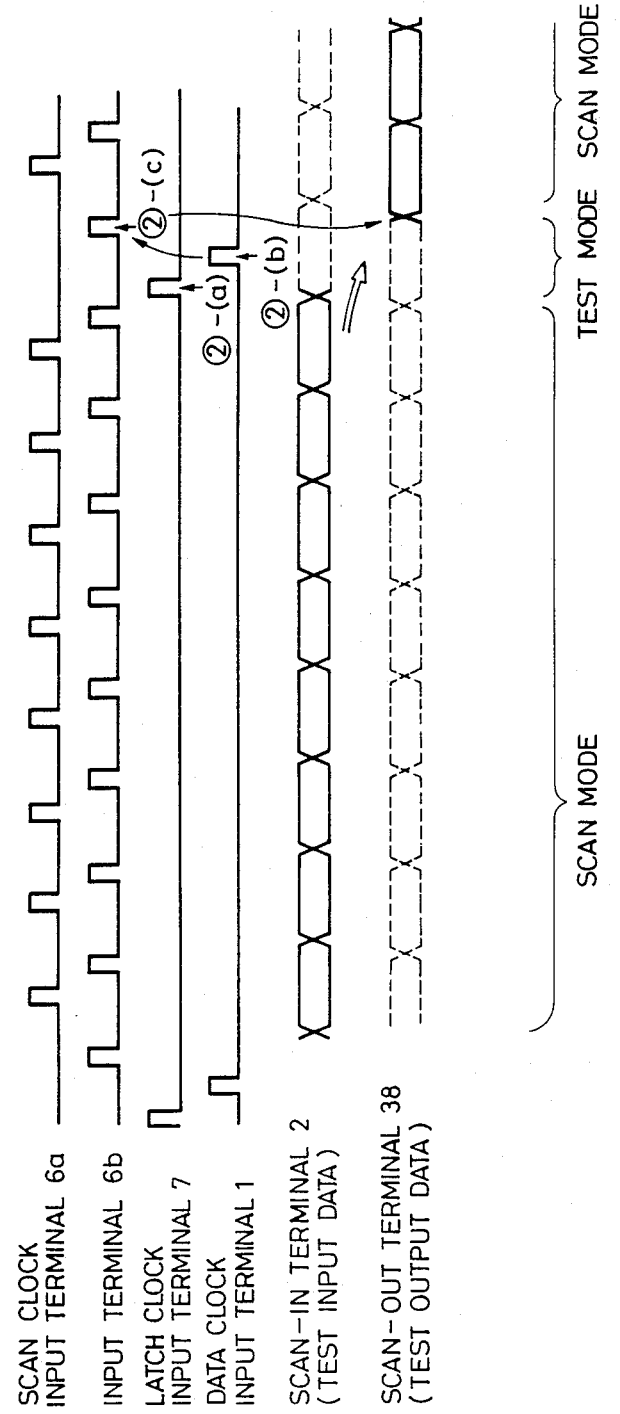
FIG. 6 is a waveform diagram showing the timings of the signals of the input and output terminals for explaining the operation of the device of FIG. 1.

(b) Non-overlapped positive clocks shown in FIG. 6 are applied to the first and second scan clock input terminals 6a and 6b to sequentially scan-in the data from the scan-in terminal 2 synchronously with the clocks to the scan registers.

(c) The output data of the circuit blocks 71 to 73 inputted at the previous testing time are sequentially scanned out from the scan-out terminal 38 simultaneously at the operation described in the above paragraph (b).

This operation will be described with reference to FIGS. 2(a) and 2(b). The signal "L" is applied to the data clock input terminal TD of the scan register in the scan mode at testing time, and the data from the scan-in terminal SI is held in the first latch 74 having the inverters 41, 42 synchronously with the first scan clock applied to the first clock terminal T1 in this case. Thereafter, the second scan clock non-overlapped with the firsts scan clock is applied to the second clock terminal T2, and the value of the first latch 74 is held in the second latch 75 having the inverters 43, 44 synchronously with the clock. As a result, the data from the scan-in terminal SI is transmitted to the output terminal Q.

The clock terminal T of the latch circuit is fixed to "L", and the latch circuit continuously applies the test data to the circuit blocks while holding the test data latched at the previous test mode time.

(2) Test Mode (a) When the desired test input data are completely set in the scan registers 8 to 16, a positive clock pulse is applied to the clock input terminal 7 for the latch. Thus, the test input data is held in the third latch of the latch circuit, and the data is applied to the circuit block. Simultaneously, the predetermined test data are applied to the data input terminals 3 to 5.

(b) When the operations of the respective circuit blocks are completed, a positive clock pulse is applied to the data clock input terminal 1. Thus, the output signals of the respective circuit blocks are held in the first latches of the scan registers through the data input terminals D of the corresponding scan registers.

(c) Then, a positive clock pulse is applied to the second scan clock input terminal 7, and the output signals of the circuit blocks are held in the second latches of the scan registers.

This operation will be described with reference to FIGS. 2(a) and 2(b). The signal "L" is applied to the first clock terminal T1 of the scan register, the data from the data input terminal D is held in the first latch 74 synchronously with the clock of the data clock input terminal TD in this case. When a positive clock pulse is further applied to the second clock terminal T2, the data from the data input terminal D is held in the second latch 75. The data (from the scan register) from the data input terminal D is held in the third latch 76 having the inverters 48, 49 synchronously with the clock signal applied to the clock terminal T in the latch circuit, and the data is applied to the circuit blocks.

(c) Then, the circuit is transferred to the scan mode, and the test is advanced.

In this manner, the circuit blocks are tested. Since the latch circuit holds the previous test pattern even during the scanning operation in the circuit of this embodiment described above and continuously applies the pattern to the circuit blocks 72, 73, the states of the respective circuit blocks do not alter even if the value of the scan register is sequentially varied during the scanning operation, and the scan test can be performed. Further, since the data held in the latch circuits 17 to 25 are scanned-in data, the test pattern can independently decide in the respective circuit blocks to readily execute the scan test.

Figure 7:
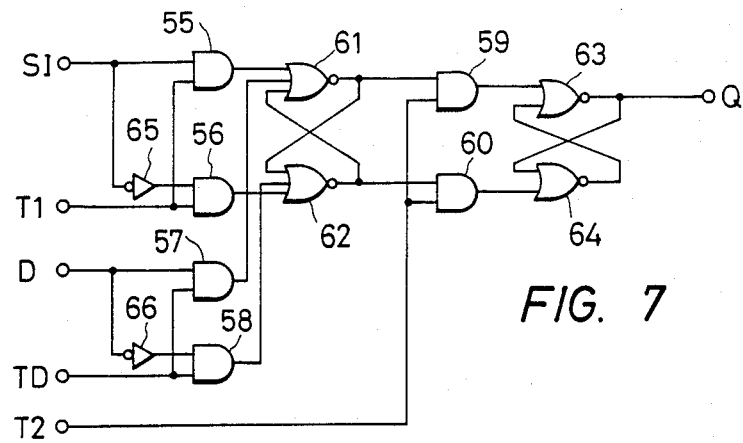
FIGS. 7, 8, 9 and 10 are circuit diagrams showing the scan register circuits according to another embodiment of the present invention.

In the embodiment described above, the scan register which has a transmission gate and an inverter has been used as the scan register. However, as shown in FIG. 7, a level sensitive scan register may be constructed of AND gates 55 to 60, NOR gates 61 to 64 and inverters 65, 66.

Figure 8:
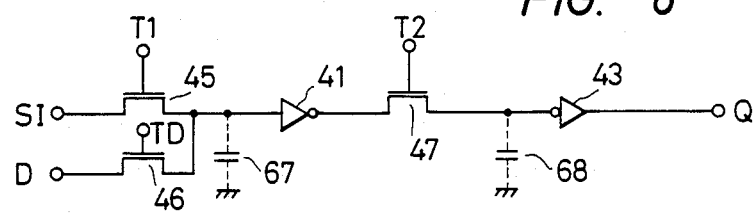

The latch in the scan register in FIG. 2(a) has used a feedback type with two inverters. However, as shown in FIG. 8, a capacitive latch from which the inverters 42, 44 of FIGS. 2(a) are removed may be employed. Numerals 67 and 68 in FIG. 8 denote parasitic capacities.

In FIG. 8, since there is no feedback type inverters, when a signal "H" is applied through any of the inputs of n-type MOS transmission gates 45 to 47, "H" level drops in the threshold value-voltage of the n-type MOS transistor. Therefore, as shown in FIG. 9, a scan register in which p-type MOS transistors 69, 70 are provided for pulling up to obtain "H" level to prevent a current from flowing through the inverters 41, 43 may be employed.

Figure 9:
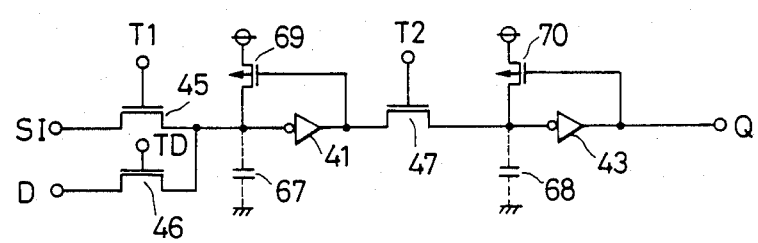

The latch type shown in FIGS. 8 and 9 may be similarly applied to the latch of FIG. 2(b).

Figure 10:
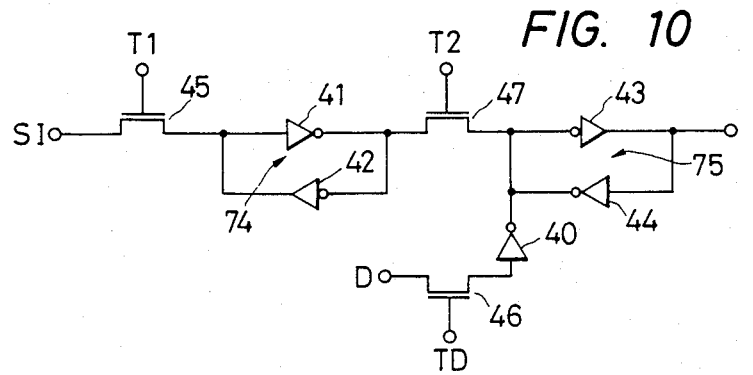

It is necessary in the scan register in FIG. 2(a) to pass the signal applied to the data input terminal D through two latches 74, 75 for the signal to arrive at the output terminal Q. However, as shown in FIG. 10, the signal applied to the data input terminal D may be passed to the output terminal Q without passing the first latch 74 by connecting the data input terminal D through the n-type MOS transistor 46 and an inverter 40 to the second latch 75.

The n-type and p-type MOS transistors and the power source potential and the ground potential in FIGS. 2(a), 2(b) and FIGS. 8 and 9 may be replaced.

According to the present invention as described above, the scan register which can be set to the through state is employed, the latch circuit which can be also set to the through state is connected to the output terminal of the scan register, and the input terminal of the corresponding circuit block is connected to the output terminal of the latch circuit. Therefore, the scan register and the latch circuit are set to the through state at the ordinary operation time to communicate the signal between the circuit blocks, while the previous test input pattern can be continuously applied to the circuit blocks to execute the scanning operation at the testing time. Consequently, the scanning test of the asynchronous sequential circuit can be readily executed, the test design can be facilitated, and the design cost of a large-scale integrated circuit including the asynchronous sequential circuit can be reduced.

Figure 11:
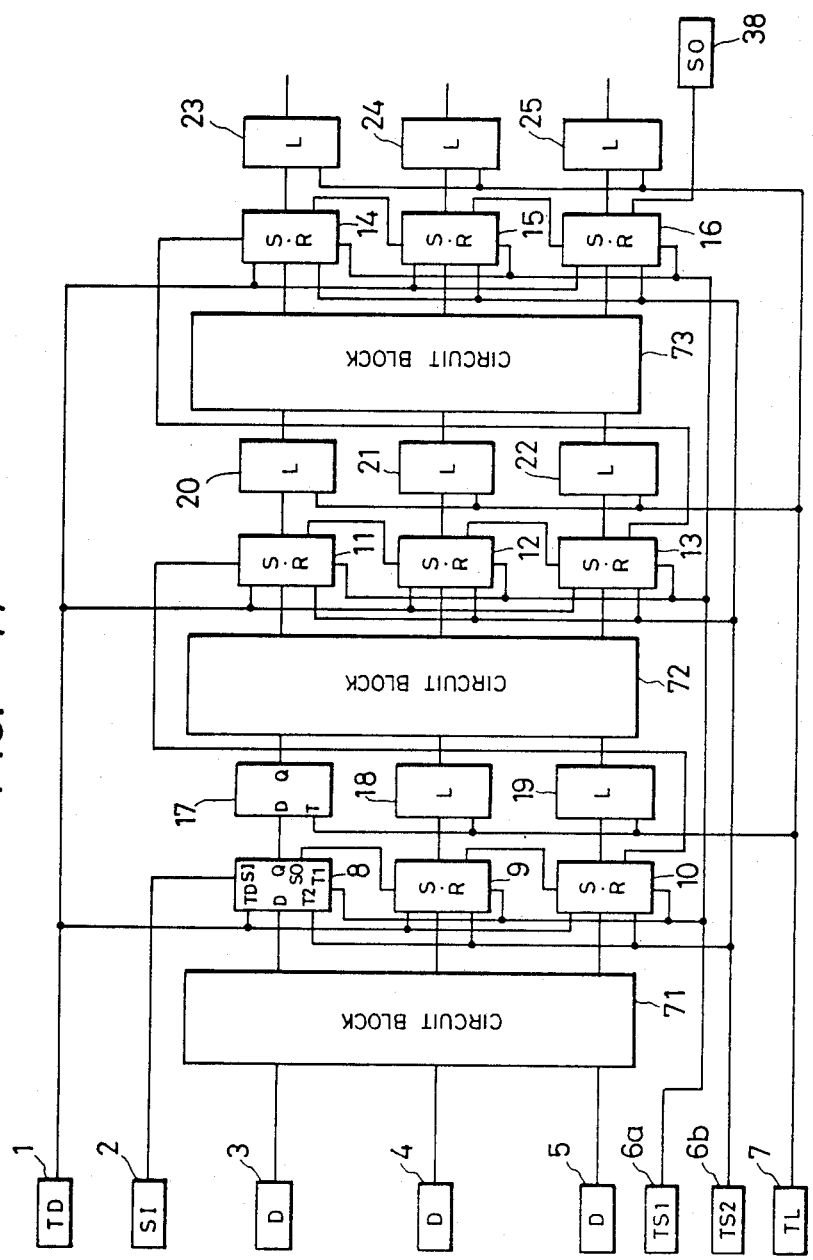
FIG. 11 is a circuit diagram of still another embodiment of a semiconductor integrated circuit device according to the present invention.
Figure 12:
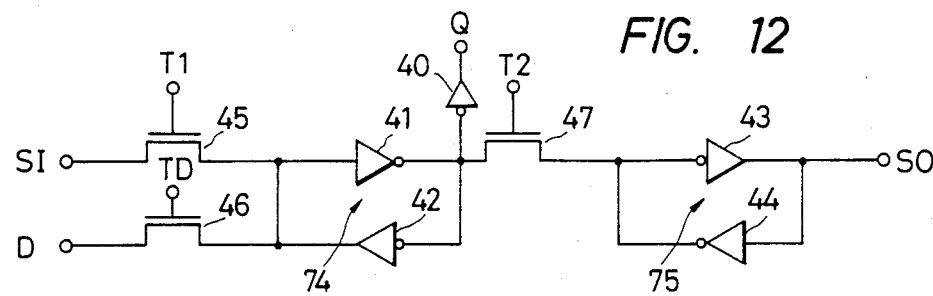
FIG. 12 is a circuit diagram showing a modified example of the scan register.

FIGS. 11 and 12 shows the construction of still another embodiment of a scan testing circuit according to the present invention, wherein the same reference numerals as those in FIGS. 1, 2, 6 and 7 denote the same or corresponding parts. In FIG. 11, reference numerals 71 to 73 denote circuit blocks formed of combination circuits or sequential circuits, and numerals 8 to 16 denote scan registers provided between the circuit blocks, having first and second latches to be able to switch from the input terminal to the first latch output terminal to a through state. Numerals 17 to 25 denote latch circuits connected to the output terminals of the first latch of the corresponding scan registers to be similarly able to switch to a through state. Numeral 1 denotes a data clock input terminal, which is connected to the data input terminals TD of the respective scan registers. Numeral 2 denotes a scan-in terminal, and numeral 38 denotes a scan-out terminal. The scan-in terminal 2 is connected to the scan in terminal SI of the scan register 8, and the output terminal SO (FIG. 12) of the scan register 8 is connected to the scan-in terminal SI of the next scan register 9, the scan-out terminal SO of the scan register is similarly sequentially connected to the scan-in terminal SI of the next scan register to resultantly form a scan pass between the scan-in terminal 2 and the scan-out terminal 38. The data output terminals Q of the scan registers are connected to the data input terminals D of the corresponding latch circuits, respectively, and the output terminals Q of the latch circuits are connected to the input terminals of the corresponding circuit blocks, respectively.

Symbols 6a and 6b denote first and second scan clock input terminals. The first scan clock input terminal 6a is connected to the first clock terminal T1 of the scan register, and the second scan clock input terminal 6b is connected to the second clock terminal T2 of the scan register. Numerals 3 to 5 denote ordinary data input terminals, which are connected to the input terminals of the corresponding circuit blocks 71, and the output terminals of the respective circuit blocks are connected to the data input terminals D of the corresponding scan registers. Numeral 7 denotes a clock input terminal for the latch.

FIG. 12 shows an example of an arrangement of the scan register. The scan register has a first latch 74 and a second latch 75. In FIG. 2(a), symbol SI denotes a scan-in terminal, symbol D denotes a data input terminal, symbols T1 and T2 denote first and second clock terminals, symbol TD denotes a data clock input terminal, numerals 40 to 44 denote inverters, numerals 45 to 47 denote n-type MOS transistors, symbol Q denotes a data output terminal, symbol SO denotes a scan-out terminal to construct a level sensitive scan register using 2-phase clocks.

The operation will be described.

An ordinary operation will be first described. The first scan clock input terminal 6a is fixed to "L" (T1="L") and the data clock input terminal 1 and the clock input terminal 7 for the latch are fixed to "H" (T1, TD, T="H") at the ordinary operation time. As a result the input and output terminals of the corresponding circuit blocks are connected directly therebetween.

This operation will be described with reference to FIG. 12. A signal "L" is applied to the first data clock input terminal T1 of the scan register, and a signal "H" is applied to the data clock input terminal TD of the scan register at the ordinary operation time to set the data input terminal D to the output terminal Q in a through state. A signal "H" is applied to the clock terminal T of the latch circuit to set the data input terminal D to the output terminal Q in a through state. Thus, the data input and output terminals of the scan register and the latch circuit become the through state at the ordinary operation time, and the input and output terminals of the corresponding circuit block are connected directly therebetween at the ordinary operation time.

The scan mode and the test mode are sequentially repeated at the testing time as follows to execute the tests of the blocks. The waveforms of the timing of the signals are shown in FIG. 6.

(1) Scan Mode (a) A signal "L" (TD="L") is applied to the data clock input terminal 1 to set a scan mode.

(b) Non-overlapped positive clocks shown in FIG. 6 are applied to the first and second scan clock input terminals 6a and 6b to sequentially scan-in the data from the scan-in terminal 2 synchronously with the clocks to the scan registers.

(c) The output data of the circuit blocks 71 to 73 inputted at the previous testing time are sequentially scanned out from the scan-out terminal 38 simultaneously at the operation described in the above paragraph (b).

This operation will be described with reference to FIG. 12. The signal "L" is applied to the data clock input terminal TD of the scan register in the scan mode at testing time, and the data from the scan-in terminal SI is held in the first latch 74 having the inverters 41, 42 synchronously with the first scan clock applied to the first clock terminal T1 in this case. Thereafter, the second scan clock non-overlapped with the firsts scan clock is applied to the second clock terminal T2, and the value of the first latch 74 is held in the second latch 75 having the inverters 43, 44 synchronously with the clock. As a result, the data from the scan-in terminal SI is transmitted to the scan-out terminal SO.

The clock terminal T of the latch circuit is fixed to "L", and the latch circuit continuously applies the test data to the circuit blocks while holding the test data latched at the previous test mode time.

(2) Test Mode (a) When the desired test input data are completely set in the scan registers 8 to 16, a positive clock pulse is applied to the clock input terminal 7 for the latch. Thus, the test input data is held in the third latch of the latch circuit, and the data is applied to the circuit block. Simultaneously, the predetermined test data are applied to the data input terminals 3 to 5.

(b) When the operations of the respective circuit blocks are completed, a positive clock pulse is applied to the data clock input terminal 1. Thus, the output signals of the respective circuit blocks are held in the first latches of the scan registers through the data input terminals D of the corresponding scan registers.

(c) Then, a positive clock pulse is applied to the second scan clock input terminal 7, and the output signals of the circuit blocks are held in the second latches of the scan registers.

This operation will be described with reference to FIG. 12. The signal "L" is applied to the first clock terminal T1 of the scan register, the data from the data input terminal D is held in the first latch 74 synchronously with the clock of the data clock input terminal TD in this case. When a positive clock pulse is further applied to the second clock terminal T2, the data from the data input terminal D is held in the second latch 75. The data (from the scan register) from the data input terminal D is held in the third latch 76 having the inverters 48, 49 synchronously with the clock signal applied to the clock terminal T in the latch circuit, and the data is applied to the circuit blocks.

(c) Then, the circuit is transferred to the scan mode, and the test is advanced.

In this manner, the circuit blocks are tested. Since the latch circuit holds the previous test pattern even during the scanning operation in the circuit of this embodiment described above and continuously applies the pattern to the circuit blocks 72, 73, the states of the respective circuit blocks do not alter even if the value of the scan register is sequentially varied during the scanning operation, and the scan test can be performed. Further, since the data held in the latch circuits 17 to 25 are scanned-in data, the test pattern can independently decide in the respective circuit blocks to readily execute the scan test.

Further, in the embodiment described above, the data output terminal Q of the scan register is provided separately from the output terminal SO of the scan data to produce the data output from the previous stage of the transmission gate 47. Therefore, the number of delay stages is reduced at the ordinary operation time to prevent the data from delaying at the transmission speed of the data.

In the embodiment described above, the scan register which has a transmission gate and an inverter has been used as the scan register. However, as shown similarly to FIG. 7, a level sensitive scan register may be constructed of AND gates 55 to 60, NOR gates 61 to 64 and inverters 65, 66.

Figure 13:
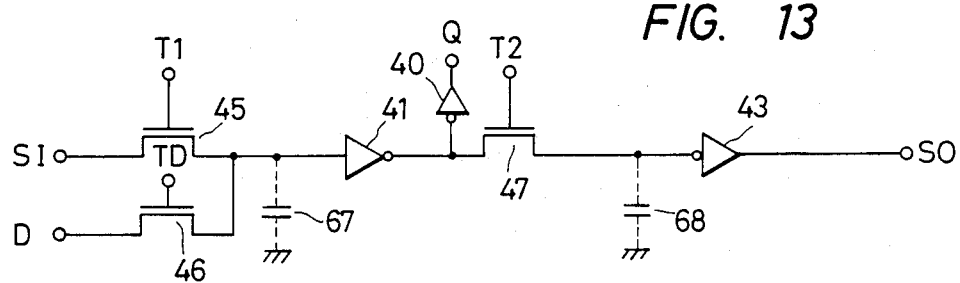
FIGS. 13 and 14 are circuit diagrams showing the scan register circuits according to still another embodiment of the invention.

The latch in the scan register in FIG. 12 has used a feedback type with two inverters. However, as shown in FIG. 13, a capacitive latch from which the inverters 42, 44 of FIG. 12 are removed may be employed. Numerals 67 and 68 in FIG. 13 denote parasitic capacities.

In FIG. 13, since there is no feedback type inverters, when a signal "H" is applied through any of the inputs of n-type MOS transmission gates 45 to 47, "H" level drops in the threshold value voltage of the n-type MOS transistor. Therefore, as shown in FIG. 14, a scan register in which p-type MOS transistors 69, 70 are provided for pulling up to obtain "H" level to prevent a current from flowing through the inverters 41, 43 may be employed.

Figure 14:
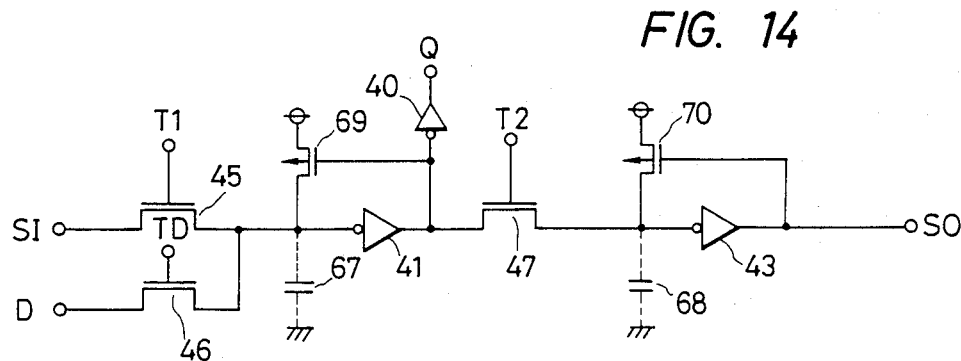

The latch type shown in FIGS. 13 and 14 may be similarly applied to the latch of FIG. 2(b).

The n-type and p-type MOS transistors and the power source potential and the ground potential in FIGS. 12 and FIGS. 13 and 14 may be replaced.

What is claimed is:

1. A semiconductor integrated circuit device for transmitting data between a previous stage circuit block and a next stage circuit block, each of said circuit blocks having at least one input data bit and at least one output data bit, at least one of said circuit blocks including a sequential circuit, said device and for enabling the circuit blocks to be scan tested said device comprising:

a plurality of scan register means connected between the previous stage circuit block and the next stage circuit block, said scan register means corresponding to the number of output data bits of said previous stage circuit block to be transmitted as the input data bits to said next stage circuit block, said scan register means for outputting the output data bits of the previous stage circuit block in an ordinary operating mode and for holding and outputting one of : (a) the output data bits of the previous stage circuit block and (b) test data for scan test synchronously with receipt of an external clock signal at testing time, means for connecting said scan register means together into a shift register configuration so that said plurality of scan register means together having a coordinated single shift register function, a latch circuit having a data input terminal and a data output terminal, said data input terminal being connected to the data output terminal of the corresponding one of said plurality of scan register means for outputting the output data of the corresponding scan register means to the next stage circuit block in said ordinary operation mode and for holding the output data of the corresponding scan register means before the scanning operation in a scan mode at said testing time and continuously applying the data to the next stage circuit block and holding and outputting the output data of the corresponding scan register means in a test mode synchronously with receipt of the external clock signal, test data setting means operatively connected to said plurality of scan register means for loading serial text data from the exterior of the circuit device into each of said plurality of scan register means, test result outputting means connected to said plurality of scan register means for sequentially outputting the data of each of said plurality of scan register means as serial data out of the circuit device, and operation switching means for switching between the ordinary operation mode and the testing operation mode and for switching between the scan mode and the test mode.

2. The semiconductor integrated circuit device as claimed in claim 1, wherein said scan register means each have first and second latches, data are outputted only through the first latch in testing mode in said ordinary operation mode and at said testing times, and the test data are outputted through the first and second latches in a scan mode at said testing time.

3. A semiconductor integrated circuit device for transmitting data between a plurality of cascaded circuit blocks at least one thereof including a sequential circuit, and for enabling the circuit blocks to be scan tested comprising:

a plurality of scan registers provided between previous stage circuit blocks and next stage circuit blocks, the number of said scan registers corresponding to the number of bits of data to be transmitted from said previous stage circuit blocks to said next stage circuit blocks, said scan registers each including means for outputting the output data of a previous stage circuit block in an ordinary operating mode and for holding and outputting one of: (a) the output data of the previous circuit block, and test data for scan test synchronously with receipt of an external clock applied thereto in a testing operation mode, said testing operation mode having a scan testing mode and test mode means connected to said plurality of scan registers for connecting said scan registers into a single shift register configuration having a unitary shift register function and common scan output terminals, a latch circuit having a data input terminal connected to the data output terminal of a corresponding scan register for outputting the output data of the corresponding scan register to the next stage circuit block in said ordinary operation mode and for holding the output data of the corresponding scan register before the scanning operation in a scan testing mode to continuously apply the data to the next stage circuit block and holding and outputting the output data of the corresponding scan register in a test mode synchronously with receipt of the external clock signal, test data setting means connected to said scan registers for loading serial test data from the exterior of the circuit device into each of said scan registers, test result outputting means connected to said scan registers for sequentially outputting the data of each scan register as serial data out of the circuit device, and operation switching means operatively connected to said scan registers and to said latch circuit means for switching between the ordinary operation mode and the testing operation mode and for switching between the scan testing mode and the test mode.

* * * * *